(12) United States Patent
Wang et al.

(10) Patent No.: US 12,011,890 B2
(45) Date of Patent: Jun. 18, 2024

(54) DEVICE AND METHOD FOR FABRICATING LOCALLY HETEROGENEOUS COMPOSITE MATERIAL BASED ON TIME-FREQUENCY REGULATED SURFACE ACOUSTIC WAVES (SAWs)

(71) Applicant: ZHEJIANG UNIVERSITY, Hangzhou (CN)

(72) Inventors: Yancheng Wang, Hangzhou (CN); Chenyang Han, Hangzhou (CN); Deqing Mei, Hangzhou (CN); Chengyao Xu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 249 days.

(21) Appl. No.: 17/762,095

(22) PCT Filed: Aug. 13, 2020

(86) PCT No.: PCT/CN2020/108878
§ 371 (c)(1),
(2) Date: Mar. 21, 2022

(87) PCT Pub. No.: WO2021/227276
PCT Pub. Date: Nov. 18, 2021

(65) Prior Publication Data
US 2022/0347947 A1 Nov. 3, 2022

(30) Foreign Application Priority Data
May 11, 2020 (CN) .......................... 202010392598.9

(51) Int. Cl.
*H10N 30/08* (2023.01)
*B29C 35/02* (2006.01)
(Continued)

(52) U.S. Cl.
CPC .......... *B29C 70/62* (2013.01); *B29C 35/0261* (2013.01); *B29C 35/0805* (2013.01);
(Continued)

(58) Field of Classification Search
CPC ........ B29C 2033/0005; B29C 35/0261; B29C 2035/0827; B29C 70/62; B29C 2791/008;
(Continued)

(56) References Cited

U.S. PATENT DOCUMENTS 5,351,127 A * 9/1994 King ................... G01N 21/553
356/136
2008/0142366 A1 6/2008 Tamirisa et al.

FOREIGN PATENT DOCUMENTS

CN 103009632 A 4/2013
CN 105679929 A * 6/2016 ............. H10N 30/08
(Continued)

OTHER PUBLICATIONS

Translation of CN 105679929 A (published on Jun. 15, 2016).*
Translation of CN 110587977 A (published on Dec. 20, 2019).*

*Primary Examiner* — Leo B Tentoni
(74) *Attorney, Agent, or Firm* — Bayramoglu Law Offices LLC

(57) ABSTRACT

A device and method for preparing a locally heterogeneous smart composite material based on time-frequency regulated SAWs are provided. The method includes: mixing functional particles, a photosensitive liquid and a photoinitiator evenly; inputting periodic time-frequency regulated sinusoidal signals defined by a frequency, a duration, an interval time and a time difference to a pair of slanted-finger interdigital transducers, such that the pair of slanted-finger interdigital transducers are excited to produce corresponding standing SAWs; coupling and allowing the standing SAWs to enter a liquid tank to form a local sound field in the photosensitive liquid; forming, by the functional particles in the photosen- (Continued)

sitive liquid, a stable array distribution under the action of an acoustic radiation force of the local sound field; and turning on an UV light source for curing, thereby completing the preparation.

2 Claims, 2 Drawing Sheets

(51) Int. Cl.
    *B29C 35/08*     (2006.01)
    *B29C 70/62*     (2006.01)
    *H03B 5/32*     (2006.01)
    *H03H 9/02*     (2006.01)
    *H10N 30/084*     (2023.01)
    *B29C 33/00*     (2006.01)
    *B29K 83/00*     (2006.01)
    *B29K 105/16*     (2006.01)

(52) U.S. Cl.
CPC ......... *H03B 5/326* (2013.01); *H03H 9/02559* (2013.01); *B29C 2033/0005* (2013.01); *B29C 2035/0827* (2013.01); *B29C 2791/008* (2013.01); *B29K 2083/00* (2013.01); *B29K 2105/16* (2013.01)

(58) Field of Classification Search
CPC ................ B29K 2105/16; H03B 5/326; H03H 9/02559; H10N 30/08; H10N 30/084
USPC ..... 264/108, 337, 442, 443, 494; 425/174.2, 425/174.4, 470; 310/313 B; 331/155
See application file for complete search history.

(56) References Cited

FOREIGN PATENT DOCUMENTS

| | | |
|---|---|---|
| CN | 105703734 A | 6/2016 |
| CN | 205488177 U | 8/2016 |
| CN | 106079439 A | 11/2016 |
| CN | 110587977 A | 12/2019 |

\* cited by examiner

DEVICE AND METHOD FOR FABRICATING LOCALLY HETEROGENEOUS COMPOSITE MATERIAL BASED ON TIME-FREQUENCY REGULATED SURFACE ACOUSTIC WAVES (SAWs)

CROSS REFERENCE TO THE RELATED APPLICATIONS

This application is the national phase entry of International Application No. PCT/CN2020/108878, filed on Aug. 13, 2020, which is based upon and claims priority to Chinese Patent Application No. 202010392598.9, filed on May 11, 2020, the entire contents of which are incorporated herein by reference.

TECHNICAL FIELD

The present disclosure relates to the technical field of rapid fabrication, and in particular to a device and method for preparing a locally heterogeneous smart composite material based on time-frequency regulated surface acoustic waves (SAWs).

BACKGROUND

The smart composite material is an innovative material that integrates sensing, control and execution functions. The functional particles in the material can sense changes in external factors such as heat, light, electricity, magnetism and stress, and enable the material to produce a desired response according to the changes, thereby controlling the material to achieve dynamic adjustment. The composition of the smart composite material is divided into two parts: matrix material and functional medium. The matrix material determines the geometry of the material and acts to withstand external loads. The functional medium is usually composed of simple substances or compounds with specific physical and chemical properties, such as dielectric, piezoelectric, photosensitive, catalytic and adsorption materials, and undertakes the functions of sensing and execution. In addition to the geometry of the material and the properties of the functional medium, a key factor affecting the sensing and execution of the smart composite material is the distribution of the functional medium in the interior space, which is homogeneous or heterogeneous. In the homogeneous distribution pattern, the functional medium is evenly distributed in the smart composite material, so any part of the material has the same response under the same external factor change. In the heterogeneous distribution pattern, the functional medium is distributed in the smart composite material according to a specific orientation or arrangement, which makes the material spatially anisotropic, greatly expanding the function and application potential of the smart composite material.

Currently, a common fabrication method of the heterogeneous smart composite material is to combine electric/magnetic field-assisted arrangement with photocuring three-dimensional (3D) printing. However, the electric/magnetic field-assisted arrangement requires the functional medium to have electromagnetic properties, so it is not applicable to other functional media such as ceramics, polymers and biological cells, resulting in a limited scope of application. SAW-assisted arrangement is a non-contact regulation technique that realizes the arrangement and movement of particles inside fluid without special requirements for the shape and physical properties of the material. In recent years, the SAW-assisted arrangement technique has received extensive attention from scholars at home and abroad in the fields of cell and macromolecular protein arrangement and biological microfluidic chips. Some scholars have proposed a method of fabricating a heterogeneous smart composite material by creating an acoustic field to assist in arranging functional particles in photosensitive liquid and then performing photocuring. However, limited by the distribution of SAWs on the lithium niobate wafer, the functional particles are usually arranged in a single array. In some studies, the region of the functional particles depends on the waveguide structure or requires a change in the acoustic boundary, which is complicated to operate and hard for dynamic control. To sum up, the prior studies lacks a device and method for preparing a locally heterogeneous smart composite material that can achieve regional position selectivity only by regulating an input signal.

SUMMARY

In order to solve the problem of poor regional selectivity in the SAW-assisted fabrication of a heterogeneous composite material, the present disclosure proposes a device and method for preparing a locally heterogeneous composite material based on time-frequency regulated SAWs.

The present disclosure adopts the following technical solutions:

1. A device for preparing a locally heterogeneous composite material based on time-frequency regulated SAWs, wherein:

a pair of slanted-finger interdigital transducers are distributed on a lithium niobate wafer; a liquid tank is placed in the centre of the lithium niobate wafer between the pair of slanted-finger interdigital transducers; the liquid tank is filled with a mixture of a photosensitive liquid, functional particles and a photoinitiator; an ultraviolet (UV) light source is fixed under the lithium niobate wafer;

the pair of slanted-finger interdigital transducers are interdigital transducers, with a finger width changing continuously in a finger length direction; and the interdigital transducers are straight-line or circular-arc in the finger length direction, correspondingly defining slanted-finger interdigital transducers or circular-arc interdigital transducers;

the pair of slanted-finger interdigital transducers are respectively excited by sinusoidal signals to generate SAWs of different frequencies in a direction perpendicular to the finger length direction on the surface of the lithium niobate wafer; the SAWs are superimposed in a central region of the lithium niobate wafer between the pair of slanted-finger interdigital transducers to form standing SAWs; and the liquid tank is located in the central region where the standing SAWs are formed;

the UV light source emits UV light into the liquid tank through the transparent lithium niobate wafer, so as to photocure the photosensitive liquid in the liquid tank; and the functional particles include but are not limited to metal powder, organic particles and cells; the photosensitive liquid and the photoinitiator usually refer to low-molecular-weight polyethylene glycol diacrylate (PEGDA) solution and 2959 photoinitiator, respectively.

2. A method for preparing a locally heterogeneous composite material based on time-frequency regulated SAWs, wherein the method includes the following steps:

step 1: mixing functional particles, a photosensitive liquid and a photoinitiator evenly, and adding a resulting mixture into a liquid tank by a pipette;

step 2: inputting periodic time-frequency regulated sinusoidal signals defined by a frequency $f_1$, a duration $t_1$, an interval time $t_2$ and a time difference to a pair of slanted-finger interdigital transducers, such that the pair of slanted-finger interdigital transducers are excited corresponding standing SAWs; coupling and allowing the standing SAWs to enter the liquid tank to form a localized acoustic field in the photosensitive liquid; and forming, by the functional particles in the photosensitive liquid, a stable array distribution under the action of an acoustic radiation force inside the localized acoustic field in a designated region; and step 3: turning on the UV light source to cure the photosensitive liquid, thereby completing the fabrication of the locally heterogeneous composite material, wherein the functional particles are fixedly distributed in an array within a localized acoustic field range;

wherein the functional particles include but are not limited to metal powder, organic particles and cells;

the periodic time-frequency regulated sinusoidal signals input into the pair of slanted-finger interdigital transducers are exactly the same in each cycle; each cycle is defined by a sinusoidal signal duration $t_1$ connected to a zero input signal duration $t_2$; the sinusoidal signal frequency within the duration $t_1$ is $f_1$, and there is a time difference $t_c$ between the periodic time-frequency regulated sinusoidal signals input into the pair of slanted-finger interdigital transducers;

a total width $a_1$ of the array distribution of the functional particles is controlled through an excitation frequency by the slanted-finger interdigital transducers, and a total length $a_2$ thereof is controlled through the duration $t_1$ and the interval time $t_2$ of the sinusoidal signals; and a width position $b_1$ of the array distribution of the functional particles is controlled through the excitation frequency by the slanted-finger interdigital transducers, and a length position $b_2$ thereof is controlled through the time difference $t_c$ between the two periodic time-frequency regulated sinusoidal signals.

The present disclosure generates corresponding SAWs by inputting the special periodic time-frequency regulated sinusoidal signals to the slanted-finger interdigital transducers, thereby realizing a localized acoustic field distribution inside the liquid tank. The present disclosure performs UV exposure after activating the arrangement of the functional particles, so as to realize the fabrication of the corresponding locally heterogeneous composite material.

The present disclosure has the following beneficial effects:

The present disclosure performs the time-frequency regulation of the SAWs, such that the functional particles in the photosensitive liquid are subjected to the acoustic radiation force of the local acoustic field to form a stable array distribution in the designated region. The present disclosure enhances the diversity of the fabrication of heterogeneous composite materials, thereby playing an important role in the fields of cell and macromolecular protein arrangement in biomedicine, flexible tactile sensors in wearable electronic devices, etc.

Figure 1:
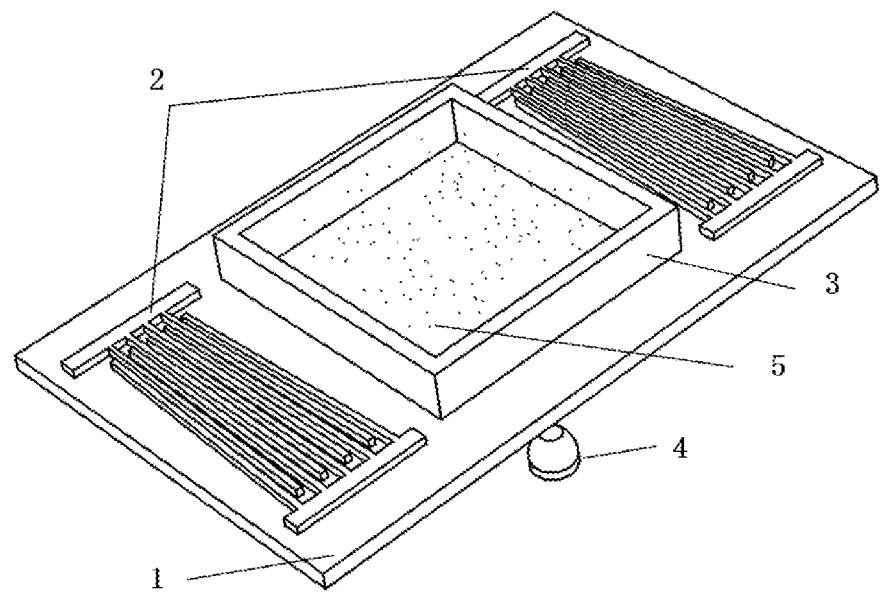
FIG. 1 is a schematic view of a device for fabrication a locally heterogeneous composite material according to the present disclosure.

Reference Numerals: (1) lithium niobate wafer; (2) a pair of slanted-finger interdigital transducers; (3) liquid tank; (4) UV light source; (5) mixture; and (6) localized acoustic field range.

DETAILED DESCRIPTION OF THE EMBODIMENTS

The present disclosure will be described in further detail below with reference to the drawings and examples, but the embodiments of the present disclosure are not limited thereto.

As shown in FIG. 1, in an experimental fabrication device of the present disclosure, a pair of slanted-finger interdigital transducers 2 are fabricated on two sides of a lithium niobate wafer 1 by a micro-electromechanical systems (MEMS) process. The pair of slanted-finger interdigital transducers 2 are usually made of aluminum or gold, with a pattern determined by a mask in the MEMS process, and a thickness determined by a sputtering time, usually 50 nm to 200 nm. A finger width of the pair of slanted-finger interdigital transducers 2 is equal to a finger spacing thereof. A liquid tank 3 is used to hold a mixture 5 of photosensitive liquid, photoinitiator and functional particles, and is provided between the pair of slanted-finger interdigital transducers 2. The liquid tank is usually made of an organic polymer material with low acoustic impedance, such as polydimethylsiloxane (PDMS), to reduce the reflection of SAWs between the lithium niobate wafer 1 and the liquid tank 3. An UV light source 4 is provided under the lithium niobate wafer 1.

In order to realize the fabrication of a locally heterogeneous composite material, the pair of slanted-finger interdigital transducers 2 may be slanted-finger interdigital transducers or circular-arc interdigital transducers. If the pair of slanted-finger interdigital transducers 2 are slanted-finger interdigital transducers, as shown in FIG. 1, the pair of variable-frequency interdigital transducers are symmetrically distributed along the lithium niobate wafer 1. If the pair of slanted-finger interdigital transducers 2 are circular-arc, centers of curvature radii of the pair of variable-frequency interdigital transducers 2 coincide at a point, and the pair of variable-frequency interdigital transducers are centrally symmetrically distributed about this point. Through the above structural design, the pair of slanted-finger interdigital transducers 2 can generate SAWs of different frequencies after being excited, and the SAWs can be superimposed in a central region of the pair of slanted-finger interdigital transducers 2 to form standing SAWs. The liquid tank 3 is located above the region where the standing SAWs are formed. In order to realize the fabrication of the locally heterogeneous composite material, the UV light source 4 emits UV light to the liquid tank through the transparent lithium niobate wafer 1 so as to perform photocuring of the photosensitive liquid in the liquid tank.

The fabrication process of the locally heterogeneous composite material of the present disclosure includes three steps:

Step 1: The functional particles, the photosensitive liquid and the photoinitiator are mixed evenly to form the mixture 5, and the mixture is added into the liquid tank 2 through a pipette. The functional particles are indicated by black dots in FIG. 2.

The functional particles include but are not limited to metal powder, organic particles and cells.

The maximum size of the functional particles is less than 1/10 of a wavelength of the SAWs, so as to avoid the influence of the functional particles on the acoustic field distribution. The photosensitive liquid is preferably a substance with a low dynamic viscosity, such as low-molecular-weight PEGDA. After the functional particles, the photosensitive liquid and the photoinitiator are mixed, an ultrasonic vibration process is performed such that the functional particles are evenly dispersed in the photosensitive liquid.

Step 2: High-frequency sinusoidal signal regulated by frequency and time are input to the slanted-finger interdigital transducers 2, so as to excite the corresponding standing SAWs. The SAWs are coupled and enter the liquid tank to form a local acoustic field in the photosensitive liquid. The functional particles in the photosensitive liquid are affected by acoustic radiation force to form a stable array arrangement in a local region 6.

Step 3: The UV light source is turned on to cure the photosensitive liquid, thereby completing the fabrication of the locally heterogeneous composite material. During the curing process, the photosensitive liquid is protected by nitrogen gas, so as to avoid the contact between the surface of the photosensitive liquid and the oxygen to cause the curing of the surface liquid to fail. After curing, the position of the functional particles remains unchanged, and the functional particles are still distributed within localized acoustic field range 6.

A method for preparing a locally heterogeneous composite material provided by the present disclosure will be described below through specific examples.

Figure 2:
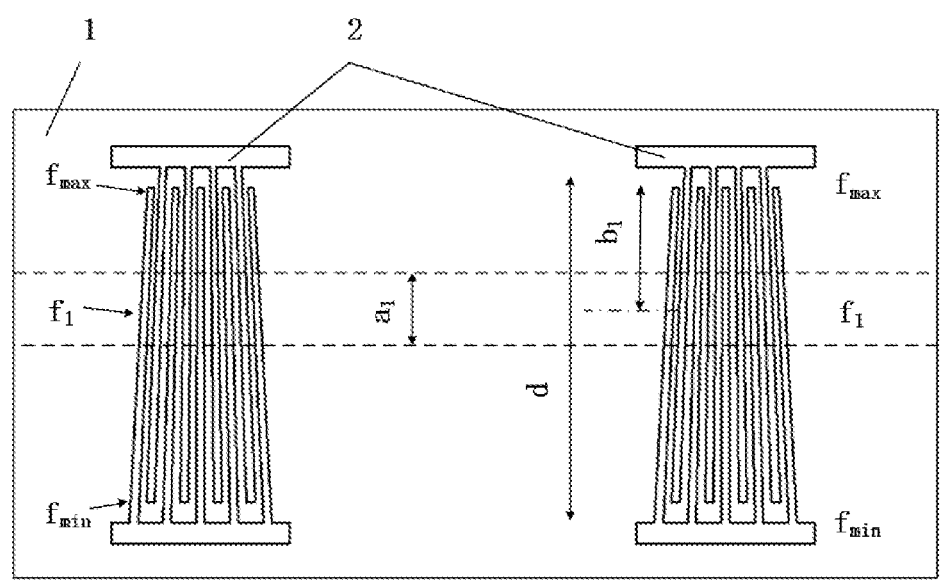
FIG. 2 shows a characteristic range of standing SAWs formed by frequency-regulated SAWs.

Example 1: Distribution Range Characteristic of Standing SAWs Formed by Frequency-Regulated SAWs FIG. 2 shows a pair of slanted-finger interdigital transducers, and it can be seen as a top view of the device in FIG. 1 without the liquid tank 3 and the mixture 5. According to the principle of the SAW transducers, the excitation frequency of the transducers corresponds to the finger width thereof, which is $f=c/4m$, wherein c is an acoustic speed in a direction of a lithium niobate wafer 1 parallel to a finger width direction of the slanted-finger interdigital transducers 2, and m is a finger width (or a finger spacing) of the pair of slanted-finger interdigital transducers. Since the finger width of the slanted-finger interdigital transducers varies, the adjustment range of the excitation frequency is $f_{min}<f<f_{max}$, and the minimum frequency $f_{min}$ corresponds to the maximum finger width. Similarly, the maximum frequency $f_{max}$ corresponds to the minimum finger width.

In an application process, due to the influence of the quality factor of the pair of slanted-finger interdigital transducers, the resonance frequency has a certain bandwidth. Therefore, when the sinusoidal signal with a specific excitation frequency of $f_1$ ($f_{min}<f_1<f_{max}$) are input, standing SAWs with a width of $a_1$ will be formed on both sides of the finger width corresponding to the specific frequency $f_1$, as indicated by the dotted line in FIG. 2. $a_1$ can be calculated by an approximate formula $a_1=1/n*f/(f_{max}-f_{min})*d$, wherein n is the interdigital pair number of the slanted-finger interdigital transducers 2, d is the acoustic aperture, that is, the total width of the electrodes, as shown in FIG. 2.

Meanwhile, the position $b_1$ of the SAWs generated by inputting the specific frequency relative to the slanted-finger interdigital transducers 2 can be calculated from the excitation frequency $f_1$ and the design parameters of the slanted-finger interdigital transducers. For the slanted-finger interdigital transducers 2 with the finger width changing evenly, the calculation formula of the position is $b_1=(f_{max}-f)/(f_{max}-f_{min})*d$.

Example 1 shows that the selectivity of the region and position of the SAWs in the width direction can be achieved by frequency regulation of the input sinusoidal signals.

Figure 3:
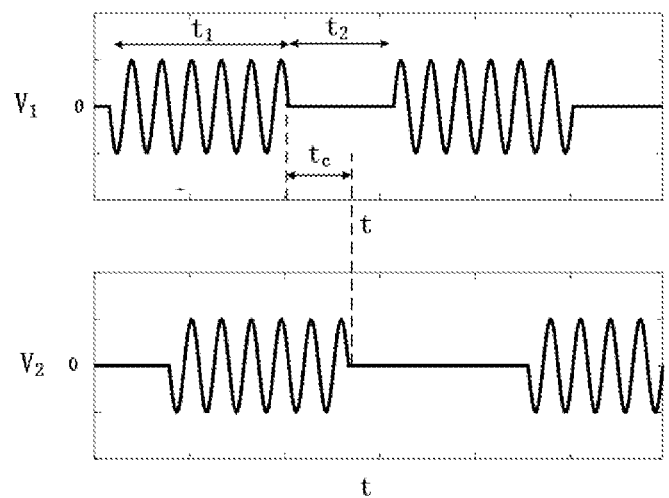
FIG. 3 shows input signals for time-regulated SAWs.

Example 2: Distribution Range Characteristic of Standing SAWs Formed by Time-Regulated SAWs For the sake of convenience, a two-dimensional (2D) situation is analyzed, that is, the SAW propagation characteristics of the slanted-finger interdigital transducers 2 along a horizontal midline section in FIG. 2 after being input with the time-regulated sinusoidal signals. The time-regulated input signals are shown in FIG. 3, wherein $V_1$ and $V_2$ are the input signals into the pair of SAW transducers respectively. $t_1$ corresponds to a sinusoidal signal and $t_2$ corresponds to a zero input signal. $V_1$ and $V_2$ are exactly the same in each cycle but there is a relative time difference $t_c$. The cycle of the sinusoidal signals corresponds to the excitation frequency of the slanted-finger interdigital transducers 2 at a specific position. $t_m$ is assumed to be a time it takes for the SAWs to be completely absorbed from excitation to propagation to the two sides of the lithium niobate wafer. To avoid superimposition of the signals at other positions, $(t_1+t_2)>t_m$. However, in an actual process, in order to ensure the maximum energy, $t_1+t_2$ is slightly greater than $t_m$.

Figure 4:
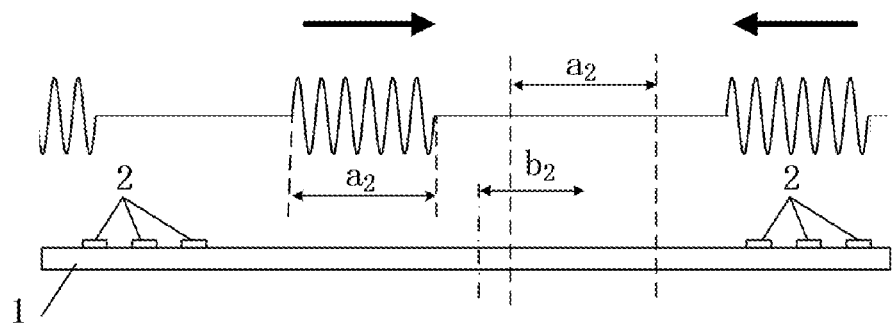
FIG. 4 shows a characteristic range of standing SAWs formed by time-regulated SAWs.

After the time-regulated signals are input, the frequency-variable interdigital transducers 2 form two traveling SAWs, as shown in FIG. 4. The two SAWs propagate in opposite directions (indicated by the black arrows in the upper part of FIG. 4) and then form standing SAWs (indicated by the dotted region). The width of the standing SAW region is the same as the width of a single traveling SAW, expressed as $a_2=t_1*c$, as indicated by the dotted line in FIG. 4, wherein c is the acoustic speed of the lithium niobate wafer 1 in the direction parallel to the width direction of the slanted-finger interdigital transducers 2. The position $b_2$ of the standing SAW forming region relative to the center of the lithium niobate wafer 1 is determined by the time difference $t_c$ of the sinusoidal signals of the two transducers, specifically, $b_2=t_c*c$. If $t_c=0$, the two SAWs meet exactly in the center of the lithium niobate wafer 1, and $b_2$ is equal to 0. Meanwhile, the position $b_2$ of the standing SAWs can be changed by adjusting the time difference $t_c$ of the periodic signals.

Example 2 shows that the selectivity of the region and position of the SAWs in the length direction can be achieved by the time regulation of the input sinusoidal signals.

Example 3: Movement and Photocuring of the Functional Particles Under the Action of the Acoustic Field In Example 1 and Example 2, the range of the standing SAWs formed by the slanted-finger interdigital transducers under the excitation of the time-frequency regulated signals can be calculated. After the SAWs are formed on the lithium niobate wafer, the SAWs will couple along a Rayleigh angle and enter the photosensitive liquid to form nodes and antinodes of the same cycle. However, in the actual process, affected by the propagation loss and the level of the photosensitive liquid, the final range of the acoustic pressure field may be slightly smaller than the region of the standing SAWs, which can be calculated in the time domain by a finite element (FE) method. Specifically, under the premise of ignoring the effect of the functional particles on the acoustic field, the acoustic field distribution $p(x,y,z,t)$ inside the photosensitive liquid is obtained in the time domain through piezoelectric coupling and acoustic-structure coupling. The final acoustic pressure distribution range $p(x,y,z)$ is obtained by calculating the integral of $1/(t_1+t_2)*(\int p(x,y,z,t)dt)$ over one input signal cycle $(t_1+t_2)$.

Within the calculated acoustic pressure distribution range, there will be periodic nodes and antinodes with a distribution cycle the same as that of the operating SAWs. Meanwhile, the acoustic pressure will exert acoustic radiation force on the functional particles inside the photosensitive liquid, such that it moves to an acoustic pressure node and finally converge at the node. That is, the cycle of the final particle arrangement is equal to half of the cycle of the operating SAWs. At this time, if the UV light source 4 is turned on, the photosensitive liquid will be cross-linked under the driving of the photoinitiator to form a macromolecular material from small molecules, and then change from liquid to solid to form the heterogeneous composite material. Since the photocuring time is usually very short, the functional particles will not move significantly during the photocuring process, so the final arrangement position of the functional particles is the same as that before curing.

Figure 5:
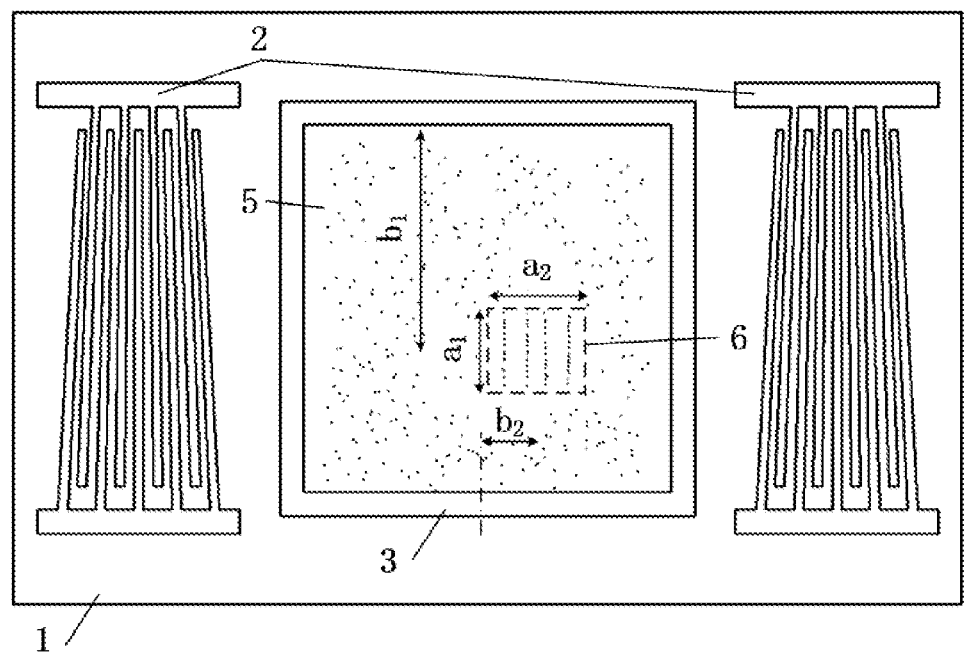
FIG. 5 shows an arrangement of functional particles in a locally heterogeneous composite material fabricated based on time-frequency regulated SAWs.

Example 4: Fabrication of a Locally Heterogeneous Composite Material Based on Time-Frequency Regulated SAWs FIG. 5 is a top view of a locally heterogeneous composite material prepared by inputting time-frequency regulated SAW signals to a pair of slanted-finger interdigital transducers 2. In this example, in this view, the lithium niobate wafer 1 is 5 mm long and 3 mm wide. The length direction of the lithium niobate wafer 1 coincides with a Y-cut 128° X-direction, then c=3940 m/s, $t_m$=1.27 µs. The slanted-finger interdigital transducers 2 are straight-line oblique in the finger length direction. The finger width ranges from 25 µm to 50 µm, corresponding to $f_{max}$ and $f_{min}$ of 39.4 MHz and 19.7 MHz, respectively. The total electrode width d=2 mm, and there are 4 pairs of electrodes. In order to clearly represent the oblique interdigital transducer, the slanted-finger interdigital transducers 2 in FIG. 5 are for illustration only, and are not drawn to the scale.

The input frequency of the pair of slanted-finger interdigital transducers 2 is 30 MHz, and the corresponding SAW wavelength is 131 µm. The duration of the sinusoidal signals is $t_1$=0.33 µs (10 sinusoidal cycles), and the interval time $t_2$=1 µs (30 sinusoidal cycles), which meets the requirement that $t_1+t_2$ is slightly greater than $t_m$. In addition, there is a time difference $t_c$=0.2 between the input signals of the pair of slanted-finger interdigital transducers 2. The size of the localized acoustic field distribution range 6 is $a_1$=0.6 mm, $a_2$=1.3 mm. The position of the localized acoustic field distribution range 6 is $b_1$=0.96 mm, $b_2$=0.76 mm.

The functional particles (indicated by the black dots) are distributed in an array within the localized acoustic field range 6 with a cycle of half the wavelength of the input SAWs (66 µm in this example). Affected by Rayleigh radiation, the specific arrangement range is slightly smaller than the localized acoustic field range 6, which can be accurately calculated by the FE method. Outside the localized acoustic field range 6, the functional particles are randomly arranged.

What is claimed is:

1. A method for fabricating a locally heterogeneous composite material based on time-frequency regulated surface acoustic waves (SAWs), applied to a device comprising a pair of slanted-finger interdigital transducers distributed on two side surfaces of a lithium niobate wafer, a liquid tank placed on a central surface of the lithium niobate wafer between the pair of slanted-finger interdigital transducers and filled with a mixture of a photosensitive liquid, functional particles and a photoinitiator, and an ultraviolet (UV) light source provided directly under the lithium niobate wafer, and the method comprising the following steps:
   step 1: mixing the functional particles, the photosensitive liquid and the photoinitiator evenly to obtain the mixture, and adding the mixture into the liquid tank by a pipette;
   step 2: inputting periodic time-frequency regulated sinusoidal signals defined by a frequency, a duration, an interval time, and a time difference to the pair of slanted-finger interdigital transducers, such that the pair of slanted-finger interdigital transducers are excited to produce corresponding standing SAWs; coupling and allowing the standing SAWs to enter the liquid tank to form a localized acoustic field in the photosensitive liquid; and forming, by the functional particles in the photosensitive liquid, a stable array distribution under an acoustic radiation force inside the localized acoustic field; and
   step 3: turning on the UV light source to photocure the photosensitive liquid and fabricate the locally heterogeneous composite material, wherein the functional particles are fixedly distributed in an array within a localized acoustic field.

2. The method for fabricating the locally heterogeneous composite material based on the time-frequency regulated SAWs according to claim 1, wherein the periodic time-frequency regulated sinusoidal signals comprises a first periodic time-frequency regulated sinusoidal signal and a second periodic time-frequency regulated sinusoidal signal, the first periodic time-frequency regulated sinusoidal signal and the second periodic time-frequency regulated sinusoidal signal are exactly the same in each cycle; each cycle is defined by a sinusoidal signal duration connected to a zero input signal duration; a sinusoidal signal frequency within the sinusoidal signal duration is $f_1$; and a time difference between the first periodic time-frequency regulated sinusoidal signal and the second periodic time-frequency regulated sinusoidal signal is $t_c$.

* * * * *